United States Patent [19]

Sheng et al.

[11] Patent Number: 5,756,376
[45] Date of Patent: May 26, 1998

[54] METHOD FOR REMOVING A DIFFUSION BARRIER LAYER ON PAD REGIONS

[75] Inventors: Yi-Chung Sheng, Taichung; Chen-Hui Chung, Hsinchu Hsien; Kuan-Cheng Su, Taipei, all of Taiwan

[73] Assignee: United Microelectronics Corporation, Hsinchu, Taiwan

[21] Appl. No.: 652,895

[22] Filed: May 23, 1996

[51] Int. Cl.$^6$ .............................. H05K 1/00; H05K 1/03
[52] U.S. Cl. ............................................. 438/100; 438/663
[58] Field of Search ............................ 438/100, 663

[56] References Cited

U.S. PATENT DOCUMENTS

| | | | |
|---|---|---|---|
| 4,307,132 | 12/1981 | Chu et al. | 438/582 |
| 4,702,967 | 10/1987 | Black et al. | 438/644 |
| 4,753,851 | 6/1988 | Roberts et al. | 438/654 |

*Primary Examiner*—John Kight
*Assistant Examiner*—Everett White
*Attorney, Agent, or Firm*—Ladas & Parry

[57] ABSTRACT

A method for removing a diffusion barrier layer on pad regions and diminishing the effect of plasma ions induced when removing a photoresist layer by a plasma asher. A two stage rapid thermal processing step is applied to the partially-removed diffusion barrier layer before a metal layer is formed. The first stage lasts a longer period of time at a lower temperature, for example, in the range of between 50 and 60 seconds at a temperature of about 600° C. The second stage lasts a shorter period of time at a higher temperature, for example, in the range of between 20 and 30 seconds at a temperature of about 750° C.

14 Claims, 9 Drawing Sheets

| a1 | b1 | c1 | d1 | e1 | f1 | g1 | h1 | i1 | j1 |
|----|----|----|----|----|----|----|----|----|----|
| a2 | b2 | c2 | d2 | e2 | f2 | g2 | h2 | i2 | j2 |
| a3 | b3 | c3 | d3 | e3 | f3 | g3 | h3 | i3 | j3 |
| a4 | b4 | c4 | d4 | e4 | f4 | g4 | h4 | i4 | j4 |
| a5 | b5 | c5 | d5 | e5 | f5 | g5 | h5 | i5 | j5 |
| a6 | b6 | c6 | d6 | e6 | f6 | g6 | h6 | i6 | j6 |
| a7 | b7 | c7 | d7 | e7 | f7 | g7 | h7 | i7 | j7 |
| a8 | b8 | c8 | d8 | e8 | f8 | g8 | h8 | i8 | j8 |
| a9 | b9 | c9 | d9 | e9 | f9 | g9 | h9 | i9 | j9 |

FIG. 5

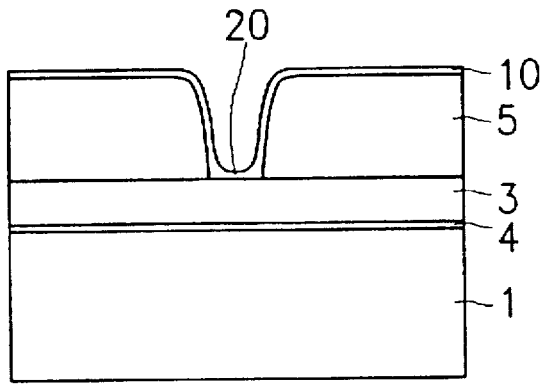
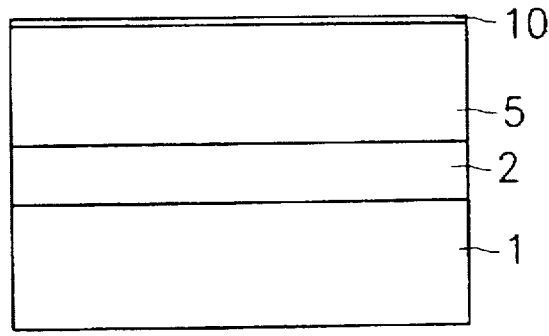
FIG. 6A   FIG. 6B
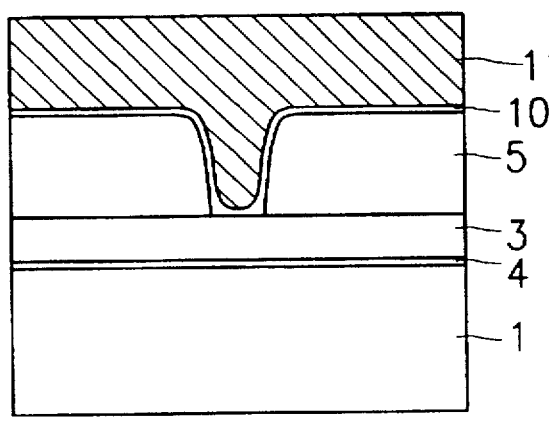
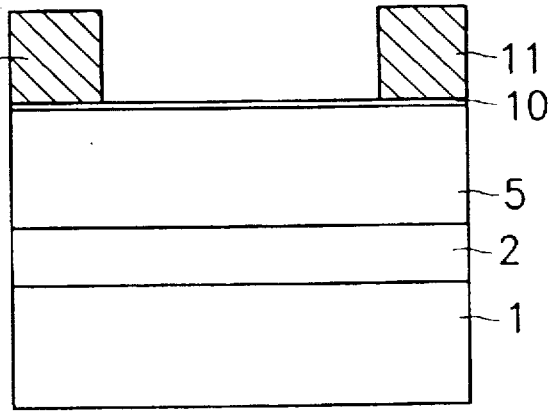
FIG. 7A   FIG. 7B

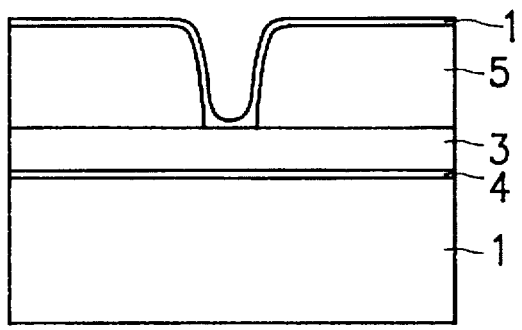
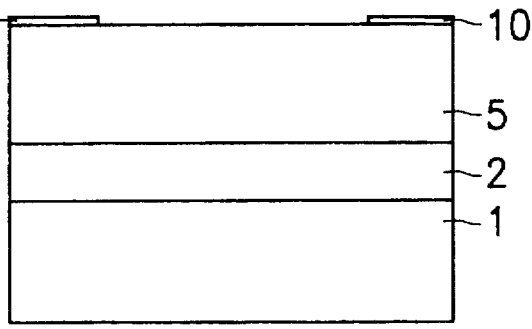
FIG. 8A  FIG. 8B
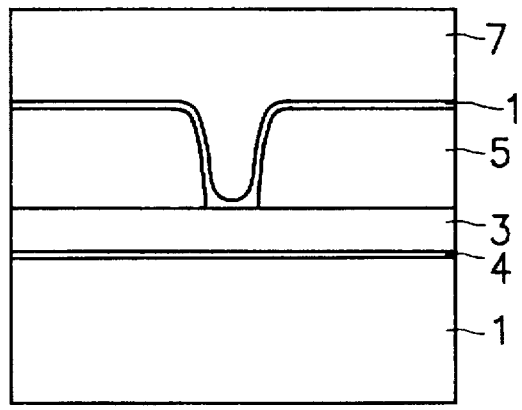
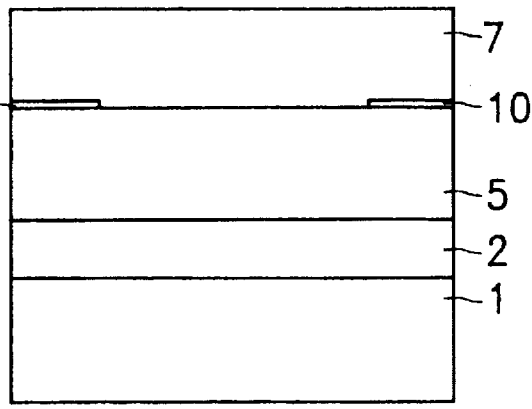
FIG. 9A  FIG. 9B

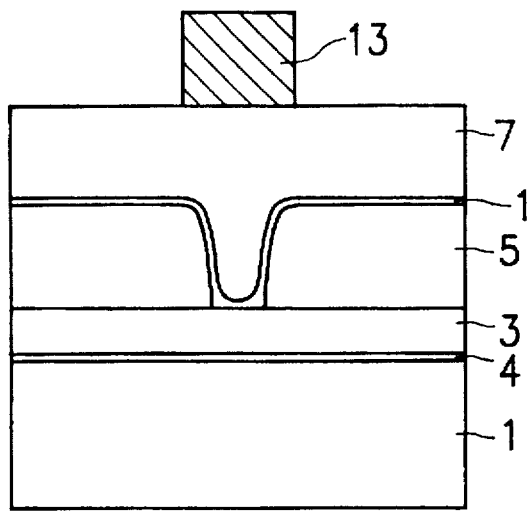
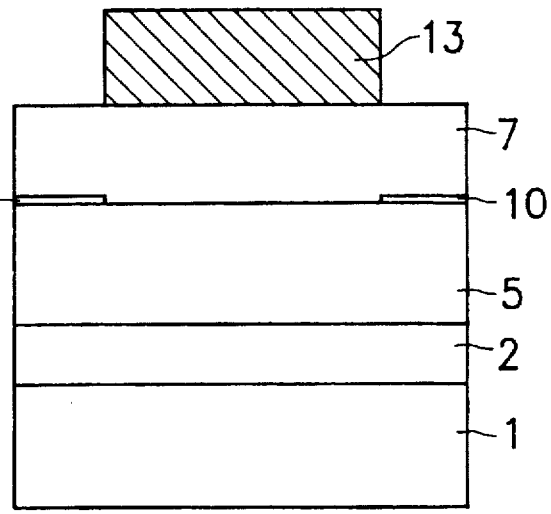
FIG. 10A              FIG. 10B
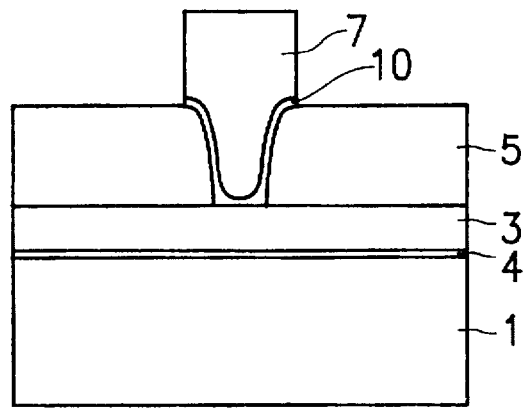
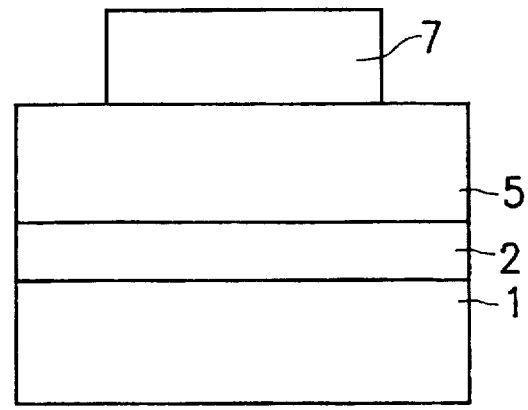
FIG. 11A              FIG. 11B

METHOD FOR REMOVING A DIFFUSION BARRIER LAYER ON PAD REGIONS

BACKGROUND OF THE INVENTION

Field of the Invention

The present invention in general relates to a semiconductor process. More specifically, the present invention relates to a method for solving the problem of contact resistance values of metal contact points rising and becoming uneven after the diffusion barrier layer on pad regions is removed, especially in the chip-on-board (COB) process.

Description of the Prior Art

COB technology, in which a bare chip is mounted on a circuit board, has been becoming more prevalent to reduce the fabrication cost. Such a technology also benefits performance and integration. Aluminum (Al) bonding is usually used in place of conventional gold (Au) bonding to form connections between pads of the bare chip and the peripheral circuitry and to improve the performance of the overall circuit.

In the Al bonding process, however, there is greater stress caused by "aluminum balls" striking the pad regions than with the Au bonding process.

FIG. 1 (PRIOR ART) illustrates a sectional view of a pad region in a chip using Au bonding. All laminated layers shown in FIG. 1 are described in some detail for clarity. Semiconductor substrate 1, usually composed of single-crystalline silicon, provides a base for circuit devices and pads. Next, oxide layer 2 is formed over substrate 1 using a field oxide process, preferably by thermal oxidation. Active regions in the device region can then be isolated from each other. Note that layers on the pad region simultaneously formed during other steps of fabricating semiconductor devices, such as the gate oxide process and the polysilicon gate process, are removed during the common process. Therefore, the next layer on the pad region is borophosphosilicate glass (BPSG) 5, which can protect the devices in the device regions and make the exposed surface smooth. After openings are formed in BPSG 5 to expose device elements, such as N+sources/drains and polysilicon gates of MOS devices, diffusion barrier layer 10 is formed over the entire chip, including the device region and the pad regions to connect a following metal layer. Diffusion barrier layer 10 can prevent interdiffusion and interface breakdown during the hightemperature processes at the metal-silicon interface. Diffusion barrier layer 10 is preferably composed of titanium nitride (TiN). Metal layer 7, usually composed of aluminum, is then formed over diffusion barrier layer 10. Gold ball 12 strikes metal layer 7, as shown in FIG. 1, to connect it to a corresponding pin of the integrated circuit.

FIG. 2 (PRIOR ART) illustrates a sectional view of a pad region in a chip using Al bonding. Except for using aluminum ball 14 to contact metal layer 7, the structure in FIG. 2 is the same as that in FIG. 1. As described above, Al bonding is usually used in the COB-packaged chip.

However, since the attachment force between diffusion barrier layer 10 and BPSG layer 5 is quite weak, stripping between diffusion barrier layer 10 and BPSG layer 5 will occur when a gold ball or aluminum ball strikes the metal layer. Such a phenomenon is called "pad peeling effect." The stress on pad regions caused by the Al-ball is usually much larger than that of the Au-ball, so that the pad peeling effect is prominently shown in FIG. 2, but not shown in FIG. 1.

Practically, in the bonding pads the pad peeling effect might also happen when the Au ball strikes the diffusion barrier layer, but the possibility of this is quite low.

There is a very efficient known method to cope with the problem of the pad peeling effect described above. This approach involves removing the diffusion barrier layer on the pad regions. Removing the diffusion barrier layer on the pad regions can avoid stripping between the TiN layer and the BPSG layer. FIG. 3 (PRIOR ART), which shows a structure without a TiN layer on a pad region, reveals that a gold ball or an aluminum ball, depicted generally as ball 16, does not cause pad peeling.

FIG. 4 (PRIOR ART) is a flowchart showing a conventional process to fabricate metal contact points without the diffusion barrier layer on the pad regions. At the beginning, all semiconductor devices and the BPSG layer thereon have already been made, as described above. In step I of FIG. 4, openings are formed in the BPSG layer to expose the electrodes of the semiconductor devices. In these openings several metal contact points will be formed. In step II, a diffusion barrier layer is formed over the entire surface including the openings and the pad regions. However, the diffusion barrier layer should be kept over the openings to avoid interdiffusion but removed on the pad regions to prevent pad peeling. Therefore, in step III, a photoresist layer is formed to mask the entire surface except the pad regions. This mask is the same as the pad mask of the common semiconductor process and will not increase the fabrication cost very much. Then in step IV, the diffusion barrier layer on the pad regions is removed through the photoresist layer. In step V, this photoresist layer is removed, for example, by a plasma asher. Thereafter, the steps following are typical of the prior art, such as forming metal contact points in the openings and bonding pads on the pad regions, as illustrated in step VI of FIG. 4.

In comparison with the common semiconductor process, the above-mentioned process to remove the diffusion barrier layer on the pad regions only adds three additional steps, including step III, step IV, and step V in FIG. 4. Its main advantage is that no additional mask is required. However, this process will cause the contact resistance values of the metal contact points to increase and be uneven. When a plasma asher removes the photoresist layer, the device electrode regions under the photoresist layer on the openings will be damaged by plasma ions through the diffusion barrier layer. Metal contact corruption causes the contact resistance to increase and be uneven, and may even cause the entire chip to fail.

Comparisons of the common semiconductor process and the conventional process that removes the diffusion barrier layer on the pad regions are made as follows: A square region that is larger than a wafer is divided into several block regions and is used to indicate locations on the wafer, as shown in FIG. 5. For clarity, each of the block regions is referred to as a cell name of a matrix, from a1 to j9. In each block region, we randomly choose a polysilicon gate/metal contact point and a diffusion region (such as a source or drain)/metal contact point on the wafer as test points, for evaluating their contact resistance values.

Table 1 and Table 2 respectively list the test data about these gate/metal contact points and diffusion region/metal contact points in a chip using the common semiconductor process. The measurement equipment is an HP-4145B. The unit is $\Omega/\square$, or resistance value per unit area.

TABLE 1

(× 10⁻²)

|   | a | b | c | d | e | f | g | h | i |
|---|---|---|---|---|---|---|---|---|---|
| 1 | — | — | −12.7 | −11.0 | −11.0 | −12.3 | −14.5 | — | — |
| 2 | — | −8.78 | −6.45 | −2.95 | −4.35 | −3.24 | −3.84 | −6.40 | — |
| 3 | — | −19.1 | −7.56 | −5.18 | −6.91 | −7.30 | −10.0 | −12.9 | — |
| 4 | −11.6 | −9.52 | −8.33 | −3.79 | −3.35 | −4.83 | −6.72 | −6.45 | −7.20 |
| 5 | −19.5 | −18.9 | −17.3 | −13.9 | −9.03 | −7.46 | −8.39 | −9.51 | −8.32 |
| 6 | −11.5 | −6.32 | −4.92 | −.855 | −.322 | −.271 | −1.42 | −2.74 | −2.94 |
| 7 | — | −6.54 | −4.76 | −5.24 | −2.24 | −2.00 | −2.50 | −2.34 | — |
| 8 | — | −8.28 | −5.39 | −5.53 | −4.80 | −4.41 | −3.51 | −.773 | — |
| 9 | — | — | −7.82 | −6.17 | −5.05 | −4.80 | −3.22 | — | — |

TABLE 2

(× 1)

|   | a | b | c | d | e | f | g | h | i |
|---|---|---|---|---|---|---|---|---|---|
| 1 | — | — | 9.685 | 9.617 | 9.354 | 9.251 | 9.308 | — | — |
| 2 | — | 9.689 | 9.703 | 9.745 | 9.484 | 9.361 | 9.393 | 9.361 | — |
| 3 | — | 9.643 | 10.21 | 10.23 | 9.941 | 9.479 | 9.398 | 9.325 | — |
| 4 | 9.850 | 9.836 | 10.10 | 10.25 | 9.983 | 9.583 | 9.305 | 9.339 | 9.220 |
| 5 | 9.371 | 9.746 | 10.14 | 9.894 | 9.978 | 9.719 | 9.604 | 9.649 | 9.798 |
| 6 | 9.690 | 10.14 | 10.16 | 10.14 | 9.838 | 9.750 | 10.04 | 10.25 | 10.17 |
| 7 | — | 9.870 | 9.992 | 10.08 | 10.08 | 9.875 | 9.969 | 10.21 | — |
| 8 | — | 9.136 | 9.616 | 9.842 | 9.923 | 9.489 | 9.875 | 9.931 | — |
| 9 | — | — | 9.195 | 9.352 | 9.418 | 8.972 | 9.286 | — | — |

In Table 1, all test data are negative numbers and might be caused by the measurement error of the measurement equipment. It is also apparent that the contact resistance values of these polysilicon gate/metal contact points are very close to zero. In Table 2, the maximum value is 10.25Ω/□ (d4), the minimum value is 8.972Ω/□ (f9), their average is 9.707Ω/□, and their standard deviation is 0.34Ω/□. It is evident that the contact resistance values of these diffusion regions/metal contact points fall in the range of 9 to 10 Ω/□.

Table 3 and Table 4 respectively list the test data about these gate/metal contact points and diffusion region/metal contact points in a chip using the process own in FIG. 4.

TABLE 3

(× 10)

|   | a | b | c | d | e | f | g | h | i | j |
|---|---|---|---|---|---|---|---|---|---|---|
| 1 | — | — | 1.544 | 1.718 | 1.581 | 1.598 | 1.813 | 1.965 | — | — |
| 2 | — | 1.605 | 1.658 | 1.127 | 1.026 | 1.065 | 1.175 | 1.843 | 2.129 | — |
| 3 | — | 1.676 | 1.248 | 1.039 | .0127 | .0130 | 1.011 | 1.336 | 2.198 | — |
| 4 | 1.871 | 1.767 | 1.075 | .0186 | .0097 | .0023 | .0262 | 1.221 | 2.048 | 2.196 |
| 5 | 1.836 | 1.834 | 1.038 | .0133 | .0098 | .0086 | .0157 | 1.214 | 1.999 | 2.647 |
| 6 | 2.007 | 2.088 | 1.311 | .0186 | .0112 | .0072 | .0255 | 1.369 | 2.243 | 2.477 |
| 7 | — | 2.499 | 1.631 | 1.159 | .0153 | .0181 | 1.237 | 1.677 | 2.768 | — |
| 8 | — | 2.694 | 2.542 | 1.781 | 1.573 | 1.529 | 1.813 | 2.584 | 3.130 | — |
| 9 | — | — | 3.035 | 3.012 | 3.170 | 3.204 | 3.070 | — | — | — |

TABLE 4

(× 10)

|   | a | b | c | d | e | f | g | h | i | j |
|---|---|---|---|---|---|---|---|---|---|---|
| 1 | — | — | 2.653 | 2.821 | 2.761 | 2.793 | 2.829 | 2.874 | — | — |
| 2 | — | 2.600 | 2.728 | 2.322 | 2.251 | 1.797 | 2.262 | 2.771 | 2.887 | — |
| 3 | — | 2.732 | 2.590 | 1.993 | 1.071 | 1.086 | 1.106 | 2.366 | 2.976 | — |
| 4 | 2.800 | 2.796 | 2.382 | 1.093 | 1.053 | 1.059 | 1.062 | 2.345 | 2.793 | 3.274 |
| 5 | 2.746 | 2.829 | 2.474 | 1.110 | 1.076 | 1.058 | 1.047 | 2.261 | 2.710 | 3.241 |
| 6 | 2.886 | 3.288 | 2.803 | 1.113 | 1.084 | 1.067 | 1.082 | 2.518 | 3.013 | 3.300 |
| 7 | — | 3.518 | 2.988 | 1.240 | 1.104 | 1.096 | 1.125 | 2.669 | 3.356 | — |
| 8 | — | 3.654 | 3.552 | 2.888 | 2.536 | 2.488 | 2.746 | 3.389 | 3.649 | — |
| 9 | — | — | 3.720 | 3.686 | 3.794 | 3.733 | 3.708 | — | — | — |

There are two main differences between the test data listed in Table 1 and 2 and that listed in Table 3 and 4.

First, in Table 3, the maximum resistance value of these polysilicon gate/metal contact points is 32.04Ω/□ (f9) and the average is 14.93Ω/□. In Table 4, the maximum resistance value of these diffusion region/metal contact points is 37.94Ω/□ (e9) and the average is 24.37Ω/□. These values are much higher than those of the common semiconductor process. This demonstrates that the contact resistance values of the metal contacts will apparently increase.

Second, in Table 3, the standard deviation is 8.827Ω/□; while in Table 4, the standard deviation is 8.827Ω/□. This reveals that the contact resistance values also will become uneven.

The increasing and uneven resistance effect may change the characteristic of partial circuitry, and even make the entire chip fail. Therefore, a new technique to remove the diffusion barrier layer on the pad regions must be developed to solve this problem.

SUMMARY OF THE INVENTION

Accordingly, an object of the present invention is to provide a method for removing the diffusion barrier layer on the pad regions, which does not cause an increase or unevenness in the contact resistance values of the metal contact points.

In accordance with the present invention a method for removing a diffusion barrier layer on pad regions is provided. The method includes the steps of forming a mask photoresist layer over the diffusion barrier layer, patterning the mask photoresist layer to expose the diffusion barrier layer on the pad regions, removing the diffusion barrier layer on the pad regions by using the mask photoresist layer, removing the mask photoresist layer, and rapid thermal processing of the remaining diffusion barrier layer.

The step of rapid thermal processing the diffusion barrier layer includes two stages. The first stage lasts a longer period of time at a lower temperature, for example, in the range of between 50 and 60 seconds at a temperature of about 600° C., while the second stage lasts a shorter period of time at a higher temperature, for example, in the range of between 20 and 30 seconds at a temperature of about 750° C.

BRIEF DESCRIPTION OF THE DRAWINGS

The detailed description of an embodiment of the present invention is made with reference to the accompanying drawings, wherein:

FIG. 5 shows a square region larger than a wafer which is divided into several block regions to indicate locations on the wafer, wherein each of the block regions is referred to as a cell name of a matrix, from a1 to j9;

FIG. 6 to FIG. 12 show sectional views of the process in this embodiment of the present invention, where FIG. 6A to FIG. 12A show sectional views of a device region and FIG. 6B to FIG. 12B show corresponding sectional views of a pad region in the same step.

PREFERRED EMBODIMENTS OF THE INVENTION

Figure 1:
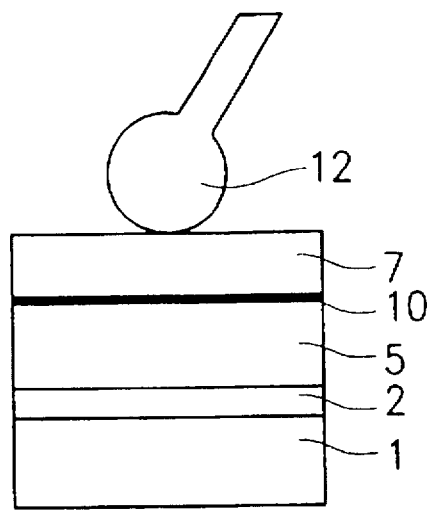
FIG. 1 (PRIOR ART) illustrates a sectional view of a pad region in using Au bonding.

Referring to FIG. 6A, gate oxide layer 4 and polysilicon layer 3 formed on substrate 1 serve as the gate electrode of an MOS device. Opening 20 in BPSG layer 5 is used to expose the gate electrode for connection to the metal layer. As described above, diffusion barrier layer 10 is formed over the entire surface, including the upper surface of polysilicon layer 3 under opening 20 and pad regions (shown in FIG. 6B). The diffusion barrier layer is preferably formed by sputtering titanium (Ti) over opening 20 and BPSG layer 5, and rapid thermal processing (RTP) the titanium metal in an atmosphere of nitrogen and argon to generate TiN compound. The RTP process, which is performed within a very short time, is used to reduce material diffusion during a reaction. Note that under opening 20 also can be another device electrode, for example, a diffusion region (such as a source or a drain of a MOS device).

Before forming metal-TiN-polysilicon contact, some additional steps must be taken to remove the diffusion barrier layer on pad regions. Referring to FIG. 7B, patterned photoresist layer 11 is formed over diffusion barrier layer 10. An unmasked region in FIG. 7B is the pad region. At the same time, diffusion barrier layer 10 on the device region (shown in FIG. 7A), especially over opening 20, is covered with photoresist layer 11. The photoresist layer is formed by conventional lithographic process. In addition, the photomask used to form this photoresist layer is the same as the pad mask of the common semiconductor process.

Referring to FIG. 8A and FIG. 8B, diffusion barrier layer 10 on the pad region is etched by using mask photoresist layer 11. However, diffusion barrier layer 10 on the device region, especially over opening 20, still remains. The diffusion barrier layer over opening 20 is kept as a buffer between the metal layer and the gate electrode, and the diffusion barrier layer on the pad region is removed to prevent pad peeling. In addition, photoresist layer 11 can be removed by using a plasma asher.

Here is an important step in this embodiment. The increased and uneven resistance in the metal contact point is mainly due to the above step of removing photoresist layer 11 by the plasma asher. Plasma ions can intrude into the contact interface and change its characteristics. Therefore, before the metal-TiN-polysilicon contact is formed, a rapid thermal process (RTP) step is used to preclude such a phenomenon. The RTP step includes two stages. The first RTP stage lasts a longer period of time at a lower temperature and the second RTP stage lasts a shorter period of time at a higher temperature. In this embodiment, the first RTP stage requires between 50 and 60 seconds at a temperature of about 600° C. The second RTP stage requires between 20 and 30 seconds at a temperature of about 750° C. Then the intruding plasma ions can be annealed, and the instances of increased and uneven resistance in these metal contact points can be diminished.

Referring to FIG. 9A and FIG. 9B, metal layer 7 is formed over the diffusion barrier layer on the device region (FIG. 9A) and over BPSG layer 5 on the pad region (FIG. 9B). In FIG. 9A, metal layer 7 and polysilicon layer 3 are electrically connected through diffusion barrier layer 10. In this embodiment, we presume that the chip uses a single-metal structure. Then metal layer 7 on the pad region (shown in FIG. 9B) also serves as a bonding pad, to connect to the peripheral circuit through a gold wire or an aluminum wire. Metal layer 7 is usually composed of aluminum.

Referring to FIG. 10A and FIG. 10B, another mask photoresist layer 13 is formed over metal layer 7. In the device region shown in FIG. 10A, photoresist layer 13 is patterned to partially mask metal layer 7 required to interconnect electrodes of the devices on the chip, for example, including contact regions of the metal layer and these electrodes (shown in FIG. 10A), and connecting wires between these electrodes (not shown) At the same time, photoresist layer 13 is also patterned to mask the metal layer on the pad region, as shown in FIG. 10B.

Referring to FIG. 11A and FIG. 11B, metal layer 7 is etched by using photoresist layer 13. Remaining metal layer 7 in the device region (shown in FIG. 11A) is used to interconnect electrodes of the device on the chip, meanwhile, that in the pad region (shown in FIG. 11B) serves as the bonding pad. This step can be done by a conventional aluminum-etching technique, such as immersion in a heated solution (35° C.-45° C.) of phosphoric acid, nitric acid, acetic acid, and water. Then, photoresist layer 13 is removed.

Figure 12A:
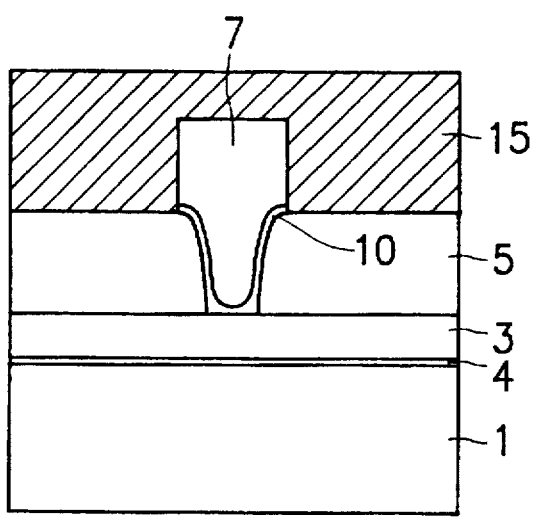
Figure 12B:
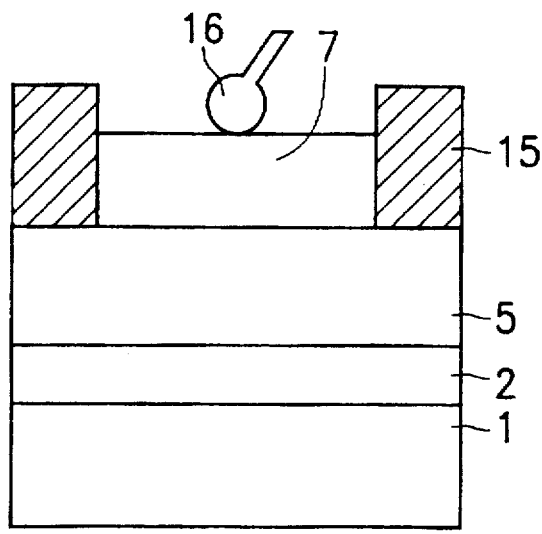

Finally, passivation layer 15 is formed over the entire surface of the chip except the pad region, to protect against contamination. Then ball 16 can hit and connect to metal layer 7 on the pad region, as shown in FIG. 12A and FIG. 12B.

Figure 13:
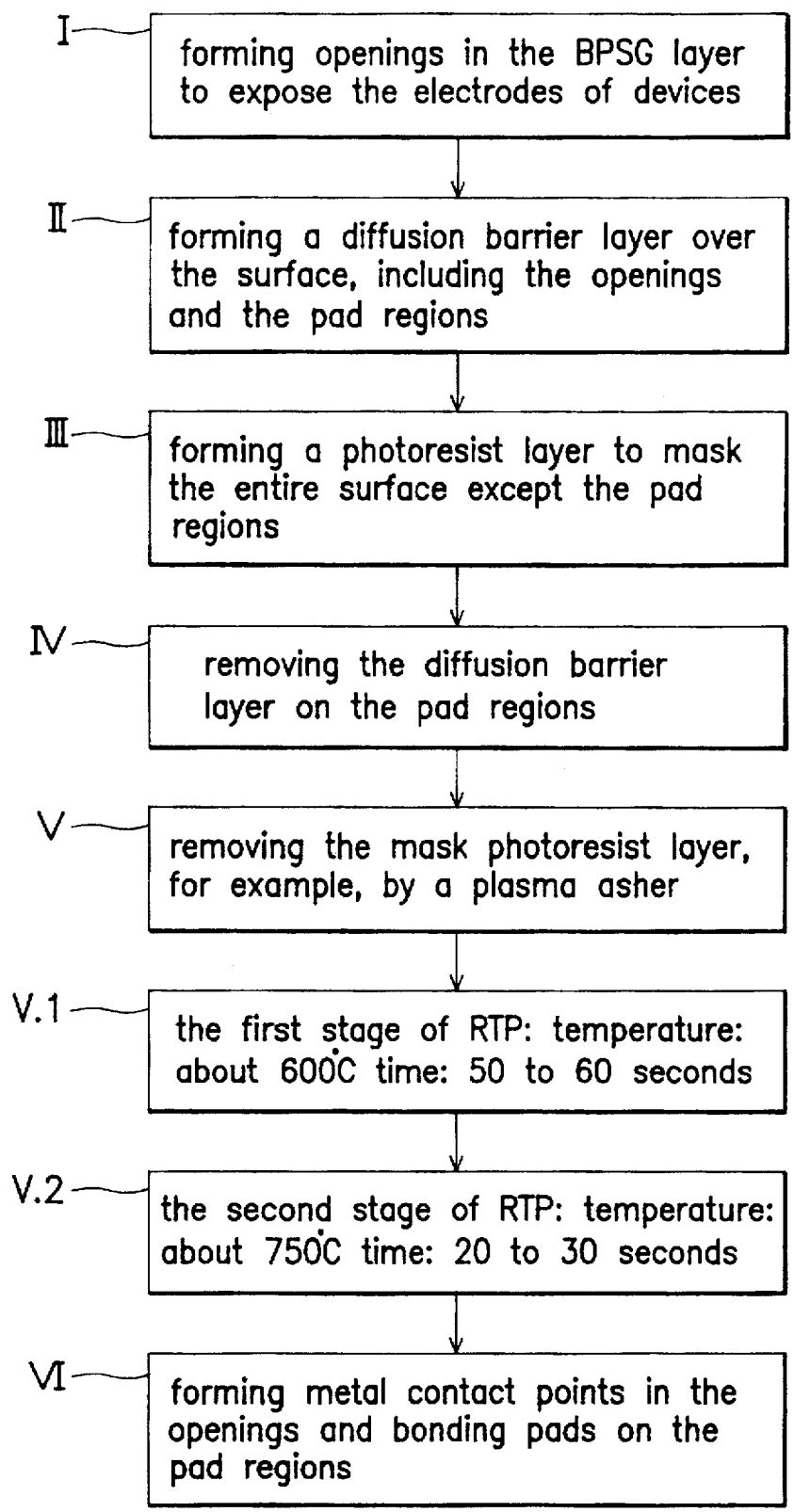
FIG. 13 is a flowchart showing the process to fabricate metal contact points without the diffusion barrier layer on the pad regions according to the present invention.

For clarity, the added steps in the present invention are illustrated in FIG. 13. Between step V (removing the photoresist layer) and step VI (forming metal contact points), there are two RTP stages, step V.1 and step V.2.

In the same way, Table 5 and Table 6 respectively list the contact resistance values about the selected gate/metal contact points and diffusion region/metal contact points in this embodiment.

TABLE 5

(× 10⁻¹)

|   | a | b | c | d | e | f | g | h | i | j |
|---|---|---|---|---|---|---|---|---|---|---|
| 1 | — | — | .4941 | 1.016 | 1.510 | 1.485 | 1.245 | .7778 | — | — |
| 2 | — | .1886 | .9821 | 1.343 | 1.658 | 1.744 | 1.697 | 1.346 | .5124 | — |
| 3 | — | .4742 | 1.115 | 1.601 | 1.486 | 1.634 | 1.785 | 1.572 | 1.091 | — |
| 4 | .1793 | .6476 | 1.195 | 1.163 | 1.500 | 1.616 | 1.655 | 1.699 | 1.200 | .4092 |
| 5 | .2048 | .6790 | 1.338 | 1.384 | 1.576 | 1.757 | 1.926 | 1.909 | 1.351 | .7655 |
| 6 | .0301 | .6255 | 1.287 | 1.392 | 1.751 | 1.855 | 1.971 | 2.158 | 1.609 | .8683 |
| 7 | — | .4555 | 1.097 | 1.235 | 1.675 | 1.912 | 2.085 | 2.217 | 1.708 | — |
| 8 | — | .2015 | .8955 | 1.331 | 1.540 | 1.790 | 1.895 | 1.662 | 1.397 | — |
| 9 | — | — | .2533 | .7761 | 1.041 | 1.350 | 1.447 | — | — | — |

TABLE 6

(× 10)

|   | a | b | c | d | e | f | g | h | i | j |
|---|---|---|---|---|---|---|---|---|---|---|
| 1 | — | — | 1.215 | 1.214 | 1.219 | 1.212 | 1.199 | 1.177 | — | — |
| 2 | — | 1.171 | 1.191 | 1.182 | 1.182 | 1.190 | 1.219 | 1.228 | 1.177 | — |
| 3 | — | 1.179 | 1.175 | 1.187 | 1.155 | 1.169 | 1.160 | 1.200 | 1.194 | — |
| 4 | 1.179 | 1.137 | 1.177 | 1.153 | 1.130 | 1.122 | 1.164 | 1.195 | 1.188 | 1.164 |
| 5 | 1.192 | 1.121 | 1.201 | 1.172 | 1.096 | 1.104 | 1.128 | 1.198 | 1.185 | 1.181 |
| 6 | 1.153 | 1.118 | 1.171 | 1.145 | 1.112 | 1.109 | 1.148 | 1.220 | 1.224 | 1.226 |
| 7 | — | 1.128 | 1.187 | 1.161 | 1.153 | 1.159 | 1.147 | 1.205 | 1.223 | — |
| 8 | — | 1.121 | 1.165 | 1.182 | 1.162 | 1.144 | 1.165 | 1.205 | 1.251 | — |
| 9 | — | — | 1.164 | 1.110 | 1.129 | 1.165 | 1.160 | — | — | — |

Figure 2:
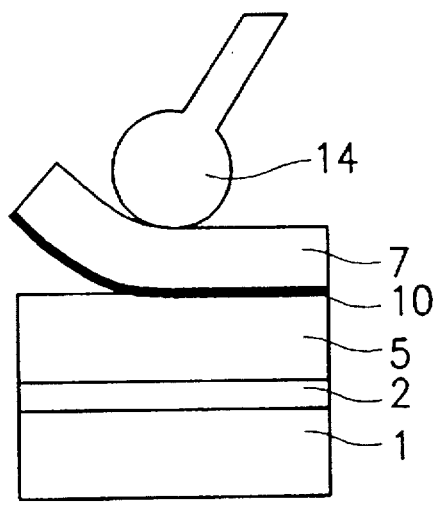
FIG. 2 (PRIOR ART) illustrates a sectional view of a pad region in a chip using Al bonding.
Figure 3:
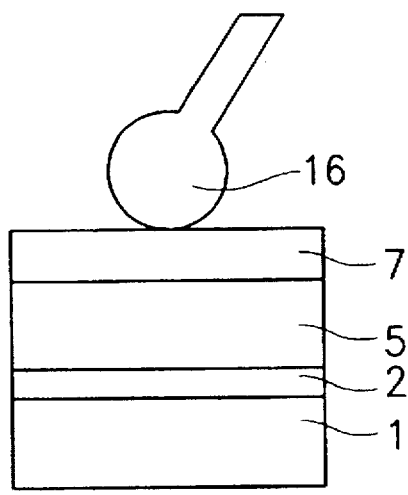
FIG. 3 (PRIOR ART) shows a structure without a TiN layer on a pad region.
Figure 4:
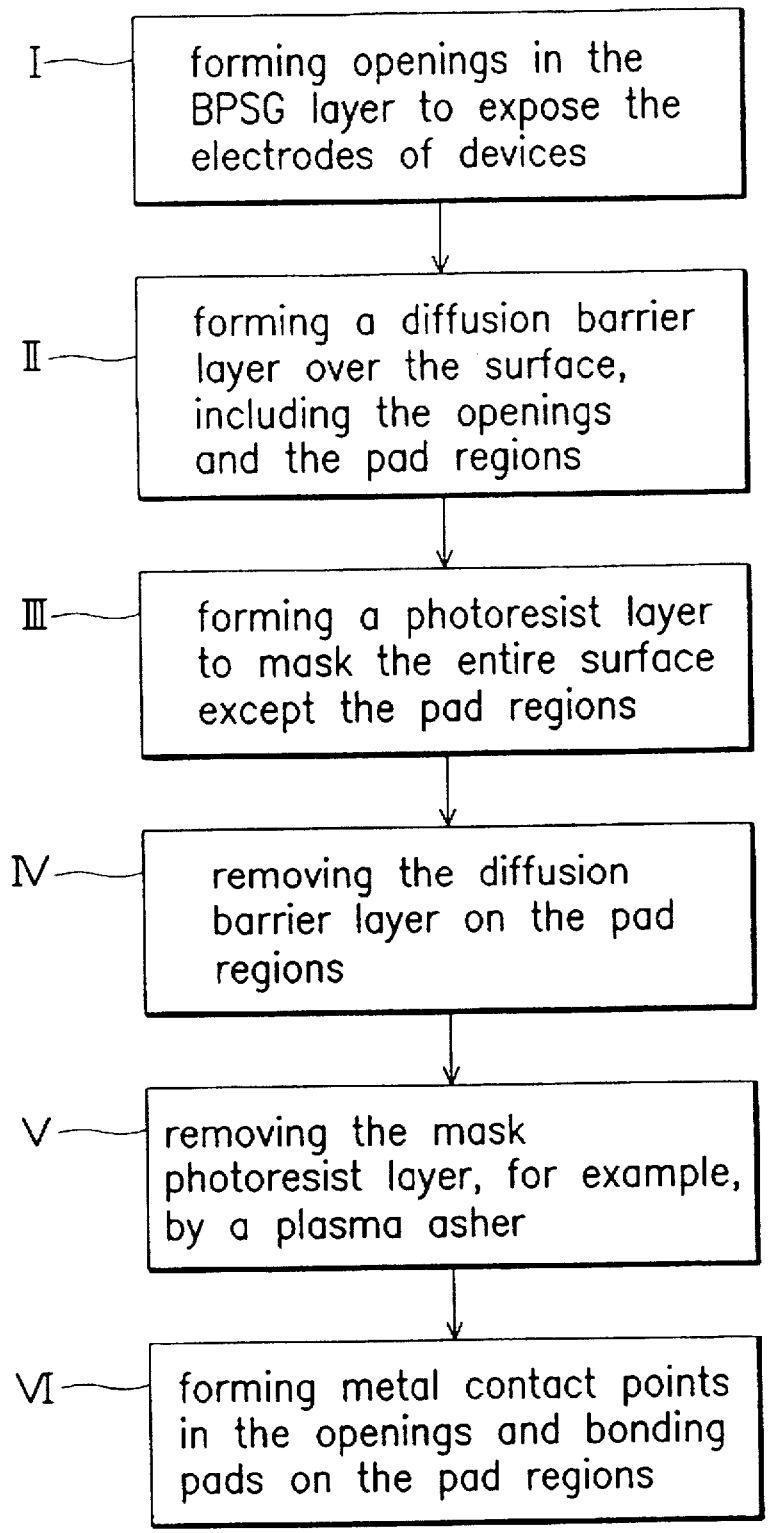
FIG. 4 (PRIOR ART) is a flowchart showing a conventional process to fabricate metal contact points without the diffusion barrier layer on the pad regions.

In Table 5, the maximum resistance value of these polysilicon gate/metal contact points is $0.2217\Omega/\square$ (h7), their average is $0.1254\Omega/\square$, and their standard deviation is $0.0537\Omega/\square$. In Table 6, the maximum resistance value of these diffusion region/metal contact points is $12.51\Omega/\square$ (i8), their average is $11.71\Omega/\square$, and their standard deviation is $0.3363\Omega/\square$. It is apparent that both the average and the standard deviation in FIG. 5 and FIG. 6 are much lower than those of FIG. 3 and FIG. 4, and close to those of FIG. 1 and FIG. 2.

The advantages of the present invention are as follows:

First, and most importantly, the increased and uneven resistance properties caused by the methodology of the prior art for removing the diffusion barrier layer on the pad regions are clearly diminished. The contact resistance values in Table 5 and Table 6, for example, are very close to those of the common semiconductor process without removing the diffusion barrier layer on the pad regions.

Second, the added step in accordance with the present invention, namely, the RTP step including two stages, is much faster than others in the process and will not constitute a "bottleneck" that reduces production efficiency.

The foregoing description of preferred embodiments the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the act to understand the invention for various embodiments and with various modifications as are suited to the particular use contemplated. It is intended that the scope of the invention be defined by the following claims and their equivalents.

What is claimed is:

1. A method for removing a diffusion barrier layer on pad regions, the method comprising the steps of:

forming a mask photoresist layer over the diffusion barrier layer and patterning the mask photoresist layer to expose the diffusion barrier layer on the pad regions;

7 removing the diffusion barrier layer on the pad regions by using the mask photoresist layer;

removing the mask photoresist layer; and rapid thermal processing of remaining diffusion barrier layer.

2. The method as recited in claim 1, wherein the diffusion barrier layer is composed of TiN.

3. The method as recited in claim 1, wherein the step of removing the photoresist layer is accomplished by a plasma asher.

4. The method as recited in claim 1, wherein the step of rapid thermal processing of remaining diffusion barrier layer includes a first stage thermal processing over a longer period of time at a lower temperature followed by a second stage thermal processing over a shorter time at a higher temperature.

5. The method as recited in claim 4, wherein the first stage in the step of rapid thermal processing is in the range of between 50 and 60 seconds at a temperature of about 600° C, the second stage is in the range of between 20 and 30 seconds at a temperature of about 750° C.

6. A method for fabricating metal contact points on a substrate, the substrate having device electrodes and pad regions, the method comprising the steps of:

forming a diffusion barrier layer over the device electrode and elsewhere;

forming a mask photoresist layer over the diffusion barrier layer and patterning the mask photoresist layer to expose the diffusion barrier layer on the pad regions of the substrate;

removing the diffusion barrier layer on the pad regions by using the mask photoresist layer;

removing the mask photoresist layer;

rapid thermal processing of the diffusion barrier layer over the device electrodes; and forming a metal layer to electrically contact with the device electrodes through the diffusion barrier layer.

7. The method as recited in claim 6, wherein one of the device electrodes is a source of an MOS device.

8. The method as recited in claim 6, wherein one of the device electrode is a drain of an MOS device.

9. The method as recited in claim 6, wherein one of the device electrode is a polysilicon gate of an MOS device.

10. The method as recited in claim 6, wherein the diffusion barrier layer is composed of TiN.

11. The method as recited in claim 6, wherein the step of removing the photoresist layer is accomplished by a plasma asher.

12. The method as recited in claim 6, wherein the step of rapid thermal processing the diffusion barrier layer includes a first stage thermal processing over a longer period of time at a lower temperature followed by a second stage thermal processing over a shorter period of time at a higher temperature.

13. The method as recited in claim 12, wherein the first stage in the step of rapid thermal processing is in the range of between 50 and 60 seconds at a temperature of about 600° C., the second stage is in the range of between 20 and 30 seconds at a temperature of about 750° C.

14. The method as recited in claim 6, wherein the metal layer is composed of aluminum.

* * * * *